United States Patent [19]
Bock et al.

[11] 3,958,184
[45] May 18, 1976

[54] TRAVELING WAVE TUBE PHASE CORRECTION LOOP

[75] Inventors: George F. Bock, Santa Ana, Calif.; Richard J. Pankow, Norwalk, Conn.

[73] Assignee: United Technologies Corporation, Hartford, Conn.

[22] Filed: June 2, 1975

[21] Appl. No.: 583,082

[52] U.S. Cl. .............................. 328/155; 328/152
[51] Int. Cl.² ...................... H03B 3/04; H03K 5/18
[58] Field of Search ........... 328/133, 134, 155, 152; 331/9, 11, 12, 18, 182; 330/124

[56] References Cited
UNITED STATES PATENTS

| | | | |
|---|---|---|---|
| 3,529,259 | 9/1970 | Holmes et al. | 331/12 |
| 3,882,413 | 5/1975 | Healy | 331/9 |
| 3,883,810 | 5/1975 | Tacussel | 328/155 |
| 3,895,312 | 7/1975 | Tipon | 331/18 |

Primary Examiner—John S. Heyman
Attorney, Agent, or Firm—M. P. Williams

[57] ABSTRACT

Phase dispersion between two or more traveling wave tubes (TWTs) is corrected on a pulse to pulse basis by a feedback loop which compares the relative phase of RF signals to be amplified in traveling wave tubes with one another, and provides a phase correction at the input to at least one of the traveling wave tubes such that the phase difference at the output of traveling wave tubes is the same as the phase difference at the inputs thereto, except for any offset therein which may be purposely inserted as desired. The phase difference at the input and at the output is achieved by phase correlators feeding sample and hold circuits, the outputs of which are converted from rectangular coordinates to polar coordinates including an angle; the phase difference angle at the input being compared with the phase difference angle taken from the output.

4 Claims, 1 Drawing Figure

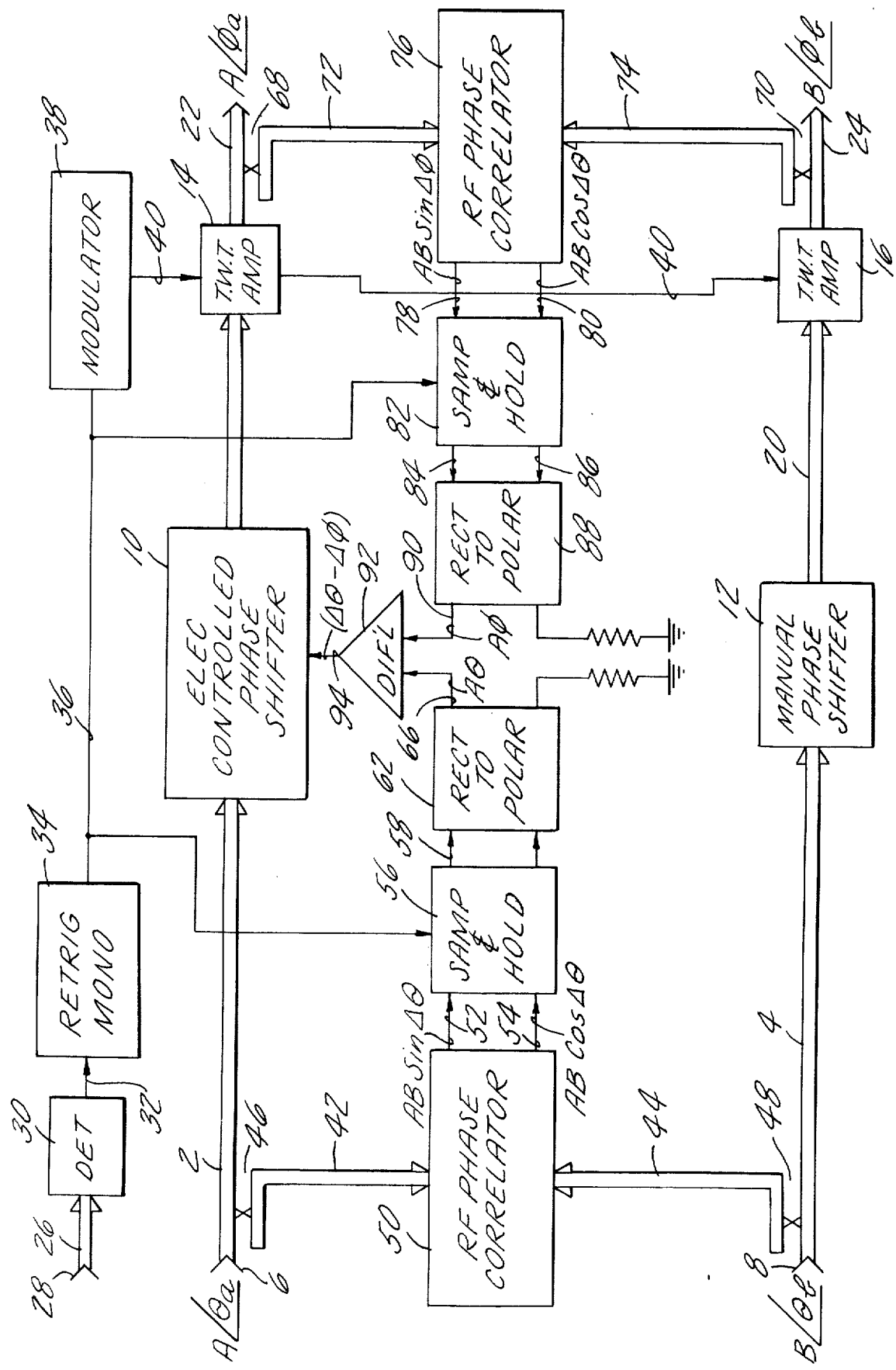

TRAVELING WAVE TUBE PHASE CORRECTION LOOP

The invention disclosed herein was made in the course of or under a contract with the Department of the Navy.

BACKGROUND OF THE INVENTION

1. Field of Invention

This invention relates to correction of phase dispersions created by amplification of related RF signals in two or more traveling wave tube amplifiers.

2. Description of the Prior Art

There are situations, such as in retrodirective arrays, in which two or more phase-related RF signals require amplification. A practical manner of amplifying RF signals is by means of traveling wave tube amplifiers. However, as is known, traveling wave tube amplifiers are very sensitive to power supply fluctuations, temperature changes, and the like; thus, phase differences created within the amplifiers themselves can vary as between two traveling wave tube amplifiers as a function of time, even if the amplifiers are carefully matched. In addition, it is difficult to find traveling wave tube amplifiers which introduce precisely the same phase change of signals amplified therein as a function of supply voltage, temperature and input frequency. This becomes particularly true when three or more traveling wave tube amplifiers are to be utilized for phase-related signals, since the difficulty of achieving a match increases geometrically with the number of amplifiers which must be matched.

A partial solution to the problem can be achieved by sensing the phase differences and comparing any dispersion of the output phase difference between two or more phase-related signals to the input phase difference of such signals, and using this phase dispersion to control the grid voltage of the traveling wave tube amplifier. However, this requires that the phase characteristics of the grid control of the traveling wave tube amplifier be known, and non-erratic. If the grid characteristic is erratic, the correcting loop will apply correction signals for error on every signal pulse received, due to the error caused by the loop itself, in addition to errors caused by power, temperature or frequency changes.

SUMMARY OF INVENTION

The object of the present invention is to provide amplification of phase-related RF signals in traveling wave tube amplifiers with phase tracking independent of grid voltage characteristics, and changes in power supply, temperature and frequency.

According to the present invention, the phase difference between phase-related signals to be amplified is determined, and the phase difference in signals which have been amplified in traveling wave tube amplifiers is determined, and the dispersion between the two phase differences is used to control the amount of a phase shift inserted in series with at least one of the amplifiers so as to eliminate the dispersion between the input and the output phase differences.

The present invention may be implemented utilizing technology and apparatus available in the art. The invention may be used in a variety of applications involving the amplification of phase-related RF signals. The foregoing and other objects, features and advantages of the present invention will become more apparent in the light of the following detailed description of a preferred embodiment thereof, as illustrated in the accompanying drawing.

BRIEF DESCRIPTION OF THE DRAWINGS

The sole FIGURE herein comprises a schematic block diagram of a preferred embodiment of the invention.

DESCRIPTION OF THE PREFERRED EMBODIMENT

Referring now to the drawing, a pair of phase-related RF signal channels each comprise a transmission line such as a waveguide 2, 4 which receive phase-related RF signals at inputs 6, 8 thereof. The inputs 6, 8 may comprise antennas for receiving phase-related signals, or any other source of phase-related RF signals. Each of the channels includes a phase-shifter 10, 12 connected to the respective waveguides 2, 4, each of which is in series with a related traveling wave tube amplifier 14, 16 connected thereto by waveguides 18, 20. The outputs of the traveling wave tube amplifiers are provided in waveguides 22, 24, which may feed antennas or other suitable utilization devices, in dependence upon how the present invention is to be utilized.

The exemplary embodiment herein assumes that the RF signals are received in pulses, rather than in continuous waves. In order to detect the presence of pulses, another waveguide 26 may be provided with a suitable input 28 (which may be an antenna if the inputs 6, 8 are antennas), the waveguide 26 feeding a simple crystal detector 30 or the like to provide a signal on a line 32 to activate a retriggerable monostable multivibrator 34. The mono 34 is sold in integrated circuit form by a number of suppliers, and basically comprises two monostable multivibrators in cascade, the first one of which determines the time of turning on the second one, and the second one of which determines the pulsewidth of the output signal therefrom. In this case, the first mono has a period about equal to the interpulse period, so that each firing of the second mono will coincide with the receipt of the next following pulse at one of the inputs 6, 8, and the pulsewidth is chosen to be sufficiently long so as to encompass all possible times of receipt of the pulses at the inputs 6, 8 together with phase delays commensurate with operation of the apparatus. The output of the mono 34 on a line 36 is applied to a modulator 38 to provide a turn-on signal on a line 40 to grids of the traveling wave tube amplifiers 14, 16. The amplifiers 14, 16 may be of any well known type, such as the Raytheon QKW-1710. Since these amplifiers consume considerable power, it is common to turn them on and off with an appropriate signal on the grid as shown in the drawing.

A portion of the energy in the waveguides 2, 4 is coupled to related waveguides 42, 44 by coupling means 46, 48, which are of any well-known type such as slots between contiguously disposed, adjacent waveguide sections. The waveguides 42, 44 provide the RF signals to an RF phase correlator 50, which may preferably comprise a phase correlator sold under the designation AY625 by Atlantic Microwave Corp., Natick, Mass. This is an RF construction consisting of RF units and demodulators to provide signals equal to the product of the magnitudes and the sine and cosine of the phase difference of the two signals applied thereto, AB sin $\Delta\theta$ and AB cos $\Delta\theta$, on a pair of lines 52, 54. These are applied to a dual sample and hold circuit 56 which is caused to sample the output of the phase correlator 50, in response to the signal on the line 36, once for each reception of pulses. The output of the sample and hold circuit is applied on lines 58, 60 to a rectangular to polar coordinate converter circuit 62, which may be of any known type, such as that sold by Computer Conversions Corp., East Northport, New York, under the trade designation RP-600. This provides an output equal to the magnitude AB on a line 64, which is terminated to ground herein since it is not utilized, and provides on a line 66 a signal manifestation of the phase difference $\Delta\theta$ between the two signals applied to the correlator 50.

A portion of the amplified signals in the waveguides 22, 24 are picked off by couplers 68, 70 and applied on waveguides 72, 74 to an RF phase correlator 76. The output of the phase correlator on lines 78, 80 similarly comprise the product of the magnitudes times the sine and cosine, respectively, of the phase difference between the output signals and the waveguides 22, 24. These signals are applied to a sample and hold circuit 82, the outputs of which are applied over lines 84, 86 to a rectangular to polar converter 88. The angular output of the converter 88 is applied on a line 90 to a differential amplifier 92 along with the output of the converter 62 on the line 66 so that the differential amplifier 92 provides on its output line 94 a signal manifestation of the dispersion between the input phase difference $\Delta\theta$ and the output phase difference $\Delta\phi$. The line 94 is applied to the control input of the electronically controlled phase shifter 10 to induce a phase shift in the signal between the waveguides 2 and 18 which is a function of the dispersion between the input and output phase differences. This provides phase tracking, in that the output phase difference $\Delta\phi$ is held to be only insignificantly different from the input phase difference $\Delta\theta$, as a function of the closed loop gain of the feedback applied, as is well known in the art.

The manual phase shifter 12 need not necessarily be used, but provides an opportunity to introduce a phase error into the waveguide 20 such that phase difference $\Delta\phi$ at the output will, without correction by the electronically controlled phase shifter 10, always be some finite value. In other words, introduction of some finite phase shift into the waveguide 20 allows the system to null at other than zero, thereby avoiding the ambiguity of going from a minimum at 0° phase difference on the line 94 to a maximum at 360° phase difference on the line 94. Whatever phase shift is introduced by the manual phase shifter 12 will cause a substantially equal phase shift to be introduced by the phase shifter 10, there being a slight difference due to the phase shift differences in the amplifiers 14, 16 which is being corrected for herein.

Additional phase shifts may be provided at the output of either of the tubes if a finite phase difference is desired to be introduced between the two output channels for any purpose, such as in a retrodirective array or the like.

The phase shifter 10 may in fact be applied at the output of the amplifier 14 as long as it is before the coupling 68 if desired; it is just simpler to provide the phase shift at the low input level of the waveguide 18 rather than at the amplified, high level in the waveguide 22.

Similarly, although the invention has been shown and described with respect to a preferred embodiment thereof, it should be understood by those skilled in the art that the foregoing and various other changes and omissions therein and additions thereto may be made without departing from the spirit and the scope of the invention.

Having thus described a typical embodiment of our invention, that which we claim as new and desire to secure by Letters Patent is:

1. Apparatus for correcting phase errors introduced in RF signal channels, comprising:

a plurality of RF signal channels, each of said signal channels including a traveling wave tube amplifier;

a plurality of phase difference detecting means, there being a pair of said phase difference detecting means for each of said plurality of channels except a first one of said channels, one of said phase difference detecting means in each pair being interposed between said first channel and a related one of said plurality of channels at the input side of the corresponding traveling wave tube amplifiers and one of said pair being interposed between the related one of said channels and said first channel at the output side of the corresponding traveling wave tube amplifiers, each of said phase difference detecting means providing a signal manifestation of the difference in phase between the related channels at the input and output sides, respectively, of the related traveling wave tube amplifiers; and means responsive to said phase difference signals of a related pair for introducing a phase shift in series with the traveling wave tube amplifier in the one of the related channels other than said first channel.

2. Apparatus according to claim 1 wherein each of said phase difference detecting means comprises:

an RF phase correlator having sine and cosine outputs;

means coupling energy from the related waveguide to a corresponding input of said RF phase correlator; and coordinate conversion means responsive to the outputs of said RF phase correlator for providing said phase difference signal.

3. Apparatus according to claim 2 further comprising:

means for generating a signal coincident with pulses of RF energy in said channels to be amplified in said traveling wave tube amplifiers; and wherein said coordinate conversion means includes sample and hold means responsive to the output of said RF correlator in the presence of said timing signal for registering the sine and cosine outputs of said RF correlator, and rectangular to polar coordinate means responsive to said sample and hold means for providing said phase difference signal.

4. Apparatus according to claim 1 further comprising:

means for introducing a fixed phase shift in said first signal channel to force said electronically controlled phase shifter to introduce an equal fixed phase shift, whereby feedback nulling of phase difference dispersion is accomplished at nominal phase shifts of other than 0° and 360°.

* * * * *